United States Patent [19]

Lindmayer et al.

[11] Patent Number: 4,983,834

[45] Date of Patent: * Jan. 8, 1991

[54] LARGE AREA PARTICLE DETECTOR SYSTEM

[75] Inventors: Joseph Lindmayer, Potomac; Charles Y. Wrigley, Ijamsville, both of Md.

[73] Assignee: Quantex Corporation, Rockville, Md.

[*] Notice: The portion of the term of this patent subsequent to Apr. 18, 2006 has been disclaimed.

[21] Appl. No.: 203,324

[22] Filed: Jun. 7, 1988

Related U.S. Application Data

[63] Continuation-in-part of Ser. No. 85,465, Aug. 14, 1987, Pat. No. 4,812,660, and a continuation-in-part of Ser. No. 34,333, Mar. 3, 1987, Pat. No. 4,822,520.

[51] Int. Cl.$^5$ .............................................. G01J 5/02
[52] U.S. Cl. ................................. 250/327.2; 250/484.1; 250/370.02; 250/363.01
[58] Field of Search ............. 250/484.1, 327.2, 370.02, 250/361 R, 363.01

[56] References Cited

U.S. PATENT DOCUMENTS

| | | |
|---|---|---|
| Re. 31,847 | 3/1985 | Luckey . |
| 2,468,452 | 4/1949 | Leverenz . |
| 2,482,815 | 9/1949 | Urbach . |
| 2,485,903 | 10/1949 | Miller . |
| 2,521,124 | 10/1950 | Miller . |
| 2,527,365 | 10/1950 | Leverenz . |
| 2,979,467 | 4/1961 | Keller . |
| 3,668,142 | 6/1972 | Luckey . |
| 3,825,757 | 7/1974 | Barrett et al. .................. 250/363.01 |
| 3,859,527 | 1/1975 | Luckey . |
| 4,211,813 | 7/1980 | Gravisse et al. . |
| 4,236,078 | 11/1980 | Kotera et al. . |
| 4,239,968 | 12/1980 | Kotera et al. . |
| 4,258,264 | 3/1981 | Kotera et al. . |
| 4,261,854 | 4/1981 | Kotera et al. ................ 250/327.2 X |
| 4,292,107 | 9/1981 | Tanaka et al. . |
| 4,400,619 | 8/1983 | Kotera et al. . |
| 4,507,562 | 3/1985 | Gassiot et al. .................. 250/484.1 |
| 4,510,174 | 4/1985 | Holzapfel et al. . |
| 4,517,463 | 5/1985 | Gassiot et al. .................. 250/327.2 |
| 4,521,904 | 6/1985 | Takano ......................... 250/484.1 B |
| 4,567,371 | 1/1986 | Ishizuka et al. . |
| 4,584,482 | 4/1986 | Suzuki et al. ................... 250/459.1 |
| 4,806,772 | 2/1989 | Lindmayer ..................... 250/484.1 |
| 4,812,660 | 3/1989 | Lindmayer ..................... 250/484.1 |
| 4,822,520 | 4/1989 | Lindmayer ..................... 252/301.45 |
| 4,830,875 | 5/1989 | Lindmayer ........................... 427/69 |
| 4,839,092 | 6/1989 | Lindmayer ......................... 250/301 |
| 4,855,603 | 8/1989 | Lindmayer ..................... 250/484.1 |
| 4,864,536 | 9/1989 | Lindmayer ........................... 365/119 |

FOREIGN PATENT DOCUMENTS 51-29889  3/1976  Japan .
1462769  1/1977  Japan .

Primary Examiner—Constantine Hannaher
Assistant Examiner—Jacob Eisenberg
Attorney, Agent, or Firm—Ostrolenk, Faber, Gerb & Soffen

[57] ABSTRACT

An improved method and apparatus for detecting and storing for later readout the impingement of certain nuclear particles utilizing a particle detector system having a large area particle detector including a thin or thick film of electron trapping material is disclosed, in which, upon impingement or detection of a nuclear particle, electrons contained in the electron trapping material jump to a higher energy level and a luminescence of a predetermined wavelength is given off by the large area particle detector. The detector may later be subjected to infrared or near-infrared pulsed radiation which will cause the release of photon luminescence of a predetermined wavelength at a position and intensity corresponding to the impinged particles, which can be detected by a suitable sensor and analyzed by a microcomputer. Particle detectors of area of at least 100 $cm^2$ are disclosed.

22 Claims, 4 Drawing Sheets

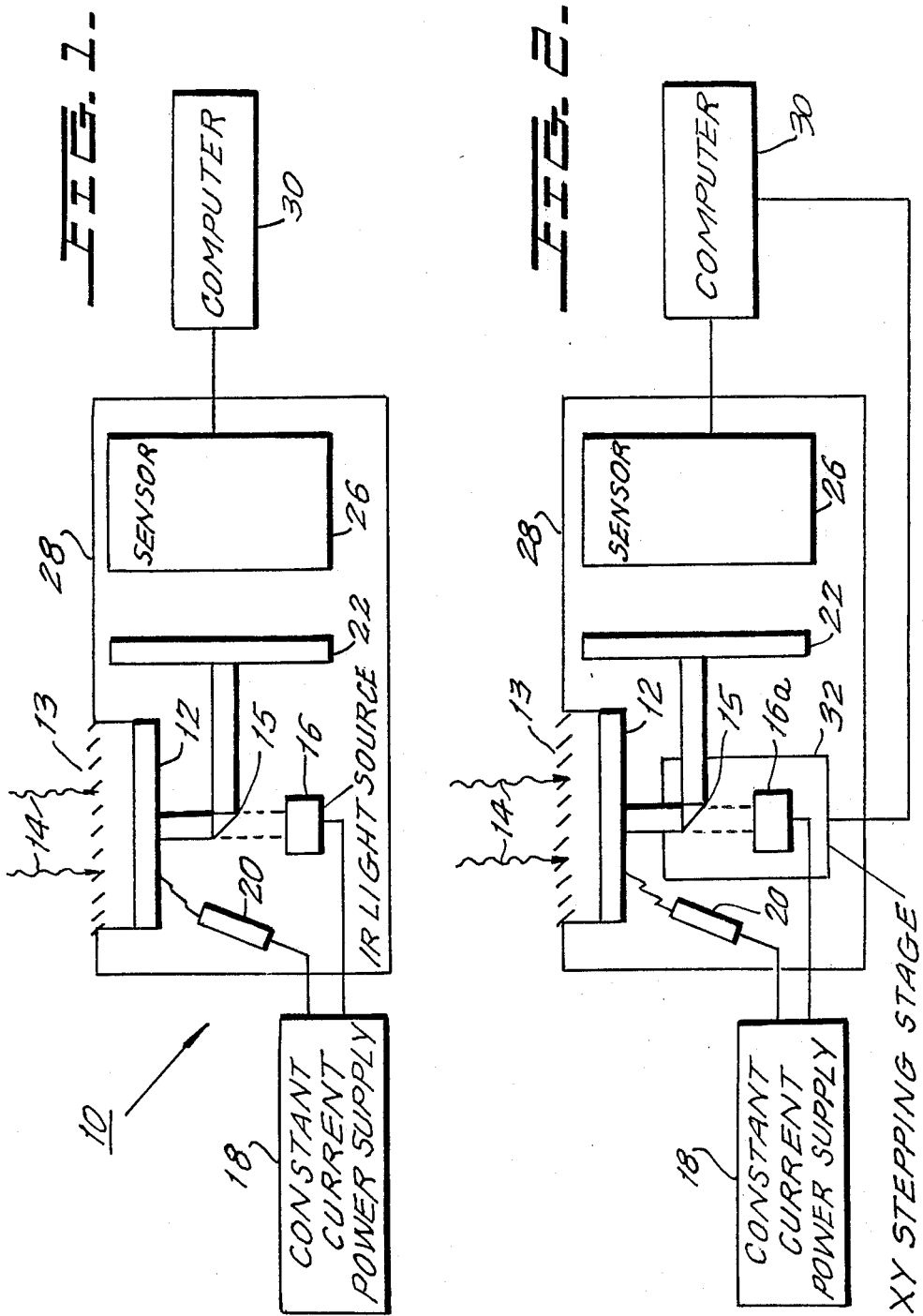

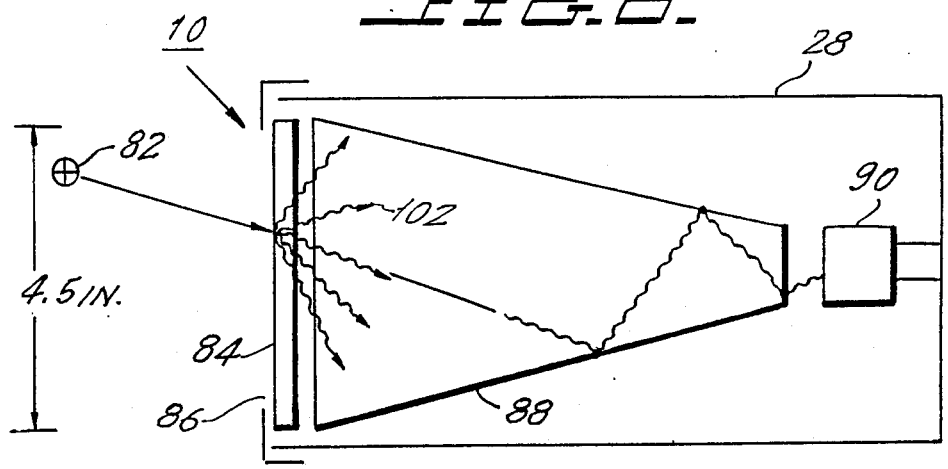
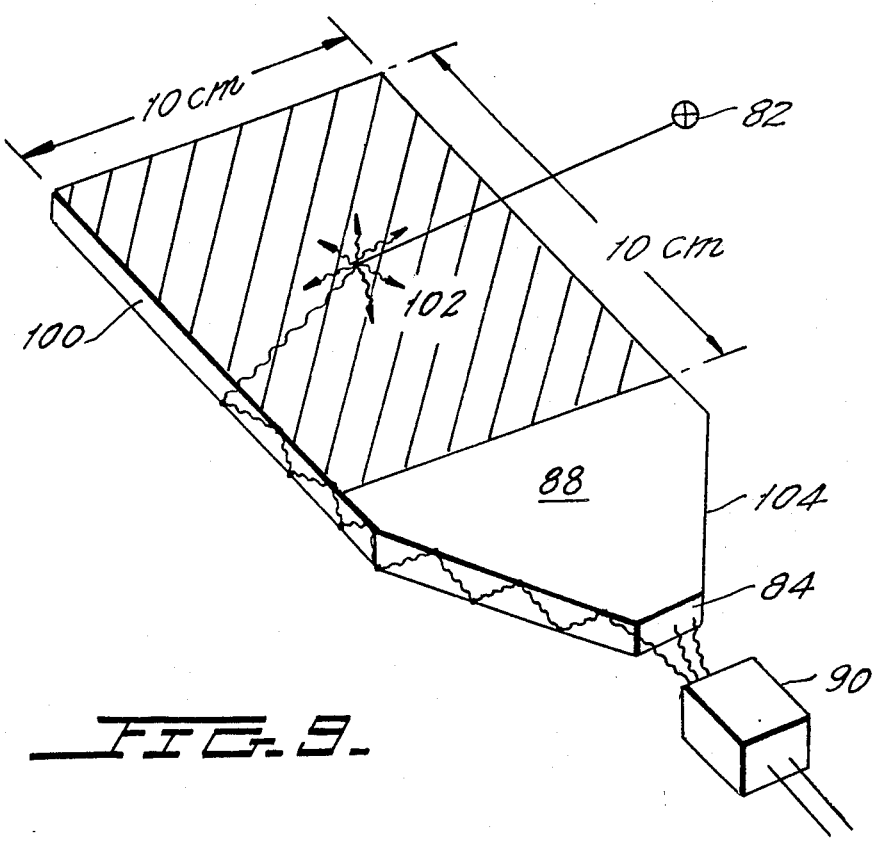

LARGE AREA PARTICLE DETECTOR SYSTEM

CROSS-REFERENCE TO RELATED APPLICATIONS

This is a continuation-in-part of U.S. application Ser. No. 07/085,465, filed Aug. 14, 1987, now U.S. Pat. No. 4,812,660 and U.S. application Ser. No. 07/034,333, filed Mar. 3, 1987, now U.S. Pat. No. 4,822,520.

The assignee of the instant application is also the assignee of the following related United States patents and patent applications: U.S. Pat. No. 4,864,536, entitled Optical Memory System and Method of Using Same; U.S. Pat. No. 4,830,875, entitled Photoluminescent Materials and Associated Process and Infrared Device; U.S. Pat. No. 4,839,092, entitled Photoluminescent Materials for Outputting Orange Light; U.S. Pat. No. 4,806,772, entitled Infrared Sensing Device Outputting Orange Light and a Process for Making Same; U.S. Pat. No. 4,812,660, entitled Photoluminescent Materials for Outputting Yellow-Light; U.S. Pat. No. 4,855,603, entitled Photoluminescent Materials for Radiology; and U.S. Pat. No. 4,915,982, entitled Method of Making Thin Film Photoluminescent Articles.

Joseph Lindmayer, one of the co-inventors herein, is the inventor of the subject matter set forth in each of those patent applications.

The disclosure of each of those related Patents and patent applications is incorporated by reference herein.

BACKGROUND OF THE INVENTION

The present invention relates generally to the detection and recording of nuclear particles. More particularly, the present invention relates to a system for detecting and recording the impingement of a nuclear particle on a two-dimensional position-sensitive solid-state detector.

One of the simplest and well known prior art devices useful for detecting and recording the presence of a nuclear particle or radiation image is photographic film which uses a silver halide. However, such materials are difficult to use under various adverse conditions, have a limited lifetime and can be generally difficult to work with. Furthermore, such materials cannot provide a precise position detection function.

The detection of nuclear particle impingement together with position sensing over relatively large areas has, in the past, generally required rather expensive two-dimensional arrays of detectors. The use of such two-dimensional arrays also requires considerably complex position-sensing circuitry for use with such arrays in order to achieve good resolution of the impingement location.

Consequently, a wide range of detectors has been developed which provide benefits over the use of detector arrays. Such detectors are generally semiconductor devices in which the radiation absorption and detection occur in the same material, for example, silicon or germanium diodes, or scintillator media mated with photomultiplier tubes in which the configuration of light produced in the scintillator is detected by the photomultiplier tube. Radiographic films have the additional drawback that they do not allow for easy retrieval of the stored information relating to the detected impingement of the radiation particles.

In the past, semiconductor detectors have generally been the most useful for particulate radiation, because the range of the particles is usually less than the depletion region depth of the detectors. Such semiconductor detectors have good energy resolution, excellent timing characteristics, good stability and simplicity of operation. However, the area of such detectors has been limited to approximately 20 $cm^2$ or less. Thus, the necessity for arraying individual detectors.

Various other methods for recording and reproducing radiation images are also known. For example, British Patent Application No. 1,462,769 and Japanese Patent Laid Open No. 29,889/1976 disclose a method in which a stimulable phosphor absorbs radiation passing through an object. The phosphor can then be stimulated using a certain kind of energy to release the radiation stored in the phosphor as luminescence which can then be detected. Both the British patent and Japanese Laid Open patent disclose a method which is a subset of that method, namely, the use of a heat-stimulable phosphor and thermal energy as the storing medium and releasing energy, respectively.

The method disclosed in those patents involves the use of a thermoluminescent phosphor layer provided on a support base for recording the impingement of radiation thereon. By heating the support base and thermoluminescent phosphor layer, the radiation energy corresponding to the radiation impingement is released as a light signal which can then be detected. However, a major drawback of that type of detector is that the use of a heat-stimulable phosphor requires that the panel or support base upon which the thermoluminescent phosphor is placed be extremely heat resistant. Furthermore, because of the necessity for heating the detector to a high temperature, local heating conditions result in poor position resolution with respect to radiation impingement. Also, the response time of such a detector is very slow due to the thermal time constants involved. In addition, the use of a $CO_2$ laser limits the position resolution achievable to 10 microns or greater.

U.S. Pat. No. 3,859,527 discloses an apparatus which does not utilize the input of heat energy in order to release the stored radiation pattern. The stimulable phosphor utilized in that patent is a visible ray or infrared ray stimulable phosphor and visible rays or infrared rays are utilized as the stimulation energy. Visible rays or infrared rays are used in order to convert the radiation energy stored in the apparatus to a light signal. However, there are only a limited number of phosphors, such as cerium and samarium activated strontium sulfide, a europium and samarium activated strontium sulfide, a europium and samarium activated lanthanum oxysulfide phosphor and a manganese and halogen activated zinc cadmium sulfide phosphor which can be used. The sensitivity of the method disclosed in the '527 patent and the phosphors employed therein is very low because the stimulability of such phosphors is very low. Thus, the method and apparatus disclosed in the '527 patent is of little practical use. Contrary to the statement at column 4 lines 11-12 of that patent, applicants have found that the cerium and samarium activated strontium sulfide composition is sensitive to tungsten light.

U.S. Pat. No. 4,239,968 discloses yet another method and apparatus for recording and reproducing a radiation image in which the radiation image is recorded on a stimulable phosphor and the recorded image is reproduced by utilizing the stimulability of the phosphor. The phosphor disclosed for use in that patent is an alkaline earth metal fluorohalide phosphor which is claimed to have high stimulability. The phosphor disclosed in that patent is represented by the formula $(Ba_{1-x}M_x^{II})FX:yA$, in which $M^{II}$ is at least one divalent metal selected from the group consisting of Mg, Ca, Sr, Zn and Cd, X is at least one halogen selected from the group consisting of Cl, Br and I, A is at least one element selected from the group consisting of Eu, Tb, Ce, Tm, Dy, Pr, Ho, Nd, Yb and Er, preferably selected from the group consisting of Eu, Tb, Ce and Tm and x and y are numbers satisfying the conditions of 0 is less than or equal to x is less than or equal to 0.6 and 0 is less than or equal to y which is less than or equal to 0.2.

The method described in the '968 patent comprises the steps of causing a visible ray or infrared ray-stimulable phosphor to absorb radiation passing through an object, stimulating the phosphor by stimulation rays selected from visible rays and infrared rays in order to release the energy of the radiation stored therein as luminescence and detecting the luminescence. The stimulation rays are described as having a wavelength of not less than 500 nm. The apparatus utilized for such recording and reproducing of a radiation image is comprised of a radiation image storage panel using a stimulable phosphor which absorbs radiation passing through an object, a light source emitting stimulation rays of not less than 500 nm in order to release the energy of the radiation stored in the phosphor as luminescence and a detector for detecting that luminescence. In both the method and apparatus aspects, the stimulable phosphor is at least one phosphor selected from the group of the above-mentioned alkaline earth metal fluorohalide phosphors.

However, the method and apparatus set forth in the '968 patent has many drawbacks. First, the intensity of the stimulating radiation is very high. Secondly, the efficiency of the phosphor disclosed therein is not efficient enough to be utilized as a relatively large area particle detector because of the sensitivity of the phosphors disclosed therein with regard to the area to be covered. A further drawback of the method and apparatus disclosed in the '968 patent is that it cannot be utilized with readily available low cost infrared sources, for example, laser diodes, since utilization of halide/phosphors require helium-neon ruby lasers. Another drawback to the method and apparatus disclosed in the '968 patent is that it has been found in use that the depth of the traps of the materials disclosed therein is insufficient for the storage of energy over a long period of time. Still another drawback to the '968 device is that it cannot readily utilize infrared wavelengths for both stimulation and emission since good separation between the stimulating and emitted wavelengths is required.

The present invention is directed to detecting impingement of nuclear particles with position sensing over large areas in which the detector provides instantaneous local scintillation at visible wavelengths upon nuclear particle impingement. In addition, storage of a trap charge at such locations is also provided which can later be interrogated and read by the application of near-infrared illumination. Such illumination may be readily provided by solid state sources such as infrared-emitting diodes or laser diodes. The solid-state materials utilized by the present invention are a family of materials known as alkaline earth sulfides and selenides that have highly unusual properties. These particular materials display efficient electron trapping and are called electron trapping materials. These materials can be "charged" by light. That is, upon energetic illumination, electrons are raised to a higher trapping state where they stay indefinitely. Upon arrival of low energy photons, such as contained in an infrared beam, these materials can emit an orange or blue light through the release of the trapped electrons.

In the 1930's and 1940's, natural thermoluminescence was observed in ordinary limestones and granites. While that effect could only be observed once, the emission properties of the limestones and granites could be restored by irradiation by x-rays or gamma rays. The effect was studied in detail and reported by F. Daniels, et al, "The Thermoluminescence of Crystals", Report On Contract AT(11-1) -27, University of Wisconsin, Madison, Wis. A general model involving trapped electrons was later accepted. See, "Electronic Processes in Ionic Crystals", N. F. Mott and R. W. Gurney, Oxford University Press, New York, 1940. Unlike that early work and the work disclosed in the British and Japanese patent applications described above, the method and apparatus of the present invention releases the trapped electrons by use of infrared or near-infrared radiation. In order to measure an accumulated dose of high energy radiation, rather than heating the sample, the dose can be "read" by, for example, infrared pulses. Such pulses will release the trapped electrons and supply an analog of the integrated dose for the previous time interval in the form of the integral released intensity of orange or blue light.

Since the state of the sensor described herein can be tested by an electromagnetic wave, which then supplies information in the form of yet another electromagnetic wave, the device described herein can be termed a photonic detector. The present application is directed to the use of such material to large areas which can be used in many different environments as a nuclear particle detector and event locator with memory.

In order to more clearly describe the family of materials which are utilized by the instant invention, it is believed useful to review the history and terms utilized in this field. The basis for this discussion is the term luminescence, which is understood to be the ability of certain solids to emit light under different conditions.

While luminescence is a long known phenomenon of nature which was first observed at least as early as the 19th century, research in this area seemed to cease with the end of World War II. While much of the early work performed by Seebeck, Becquerel, Leonard, Charbonneau and Urbach demonstrated the existence of the phenomenon and attempted to apply it to practical use, the sensitivities of the known phosphors at that time were far too low for practical use.

After World War II, extensive work continued in the area of cathodoluminescence for use with the screens of cathode ray tubes, and other applications which involve the down conversion of photon energy, rather than the up conversion utilized by the present invention. It is relatively easy to produce the instantaneous emission of light from solids utilizing excessive incoming photon or particle energy, such as accelerated electrons, ultraviolet radiation, x-rays, etc. However, the use of up converting materials, such as infrared phosphors, has been practically nonexistent over the last forty years.

Due to the limited amount of work with phosphors and the time period over which such work was performed, the state of the infrared phosphor field is primitive indeed. Only minimal theories explaining the operation of such materials and little working technology existed prior to the work by the assignee of the present invention. It should be remembered that in the early 1940's, even the electronic structure of materials was still not fully understood, although the concept of band gap was introduced just a few years earlier and Schottky was explaining the electrical characteristics of metal-semiconductor junctions. Schottky, et al. discovered the transistor in 1949 and the theories and applications of solid state materials took an explosive course. Materials with traps, however, were not part of this revolution and, in fact, a whole generation of semiconductor physicists regarded trapping effects as a highly undesirable phenomenon and continuously worked to keep this disturbing effect from influencing their semiconductor devices.

While luminescence refers to the ability of certain solids and liquids to emit light when driven by an external energy source, when the driving energy source is light, the proper term for that phenomenon is photoluminescence. While certain photoluminescent materials will emit light when driven by radiation of short wavelengths, such as ultraviolet, there is another class of materials, which, upon excitation by illumination, can store electrons in "traps" for extremely long time periods. The trapped electrons can later be released, upon command, by less energetic photons. If the emission of visible light is activated by, for example, infrared illumination, a photon energy up conversion takes place because energy is stored in the material. The present invention relates to that class of materials with the unique properties of electron traps. Utilizing such optical up conversion from one wavelength to another, optical communications can be accomplished, as well as making infrared radiation patterns visible. In further applications, in a light-to-light photonics mode, such materials will be used in digital processing or so-called "light" computers.

SUMMARY AND OBJECTS OF THE INVENTION

In view of the foregoing, it should be apparent that there exists a need in the art for a method of and apparatus for detecting various nuclear particles over relatively large areas by means of an inexpensive two-dimensional detector system utilizing readily available and low powered infrared and near-infrared light sources. It is, therefore, a primary object of this invention to provide a method of and apparatus for detecting and storing the location of various nuclear particle impingements which is characterized by an electron trapping material and which has particular application for obtaining quantitative information concerning nuclear particle events with respect both to their quantity and spatial distribution.

More particularly, it is an object of this invention to provide a nuclear particle detection system utilizing electron trapping materials in which, when the particles impinge on the large area particle detector, visible light is released by a solid-state electron trapping material contained on said detector which corresponds to the position of the detected particles and linearly corresponds to the quantity of such detected particles.

Still more particularly, it is an object of this invention to provide a method of and apparatus for "reading" the stored information on the large area particle detector at a time up to years after the impingement of those particles on the electron trapping material of the detector.

Another object of the present invention is to provide a reliable and relatively inexpensive method of and apparatus for detecting, storing and analyzing the existence of certain nuclear particles within a specified environment.

A further object of the present invention is to provide a method of and apparatus for reading the stored particle or pattern information from the large area particle detector electron trapping material utilizing infrared or near-infrared energy which, upon impinging upon the large area particle detector electron trapping composition, releases light of a predetermined range of wavelengths.

Still another object of the present invention is to provide a method of and apparatus for erasing the stored nuclear particle information embodied by the electron trapping material of the large area particle detector so that such particle detector can be reused.

Briefly described, these and other objects of the invention are accomplished in accordance with the apparatus aspects by providing a nuclear particle detector system having a large area particle detector with a surface area of at least 100 cm$^2$ which contains either a thick or thin film electron trapping material. Upon impingement of a nuclear particle on such electron trapping material, a packet of visible light is given off and information concerning the flux of the particle and its location is stored as trapped electrons raised to a higher energy level within the electron trapping material.

The detector system can utilize the packet of visible light given off during impingement or, in a preferred embodiment, a solid-state light source placed facing either the front or back of the large area particle detector is utilized to release the stored electrons to allow them to move to a lower energy level, which results in the giving off of light at a certain predetermined range of wavelengths having a peak about a predetermined wavelength, depending upon the composition of the electron trapping material. This "reading" of the stored nuclear particle information can take place up to years after the original impingement of the nuclear particles.

The release of the stored nuclear particle information in the form of light of a predetermined wavelength corresponds to the x-y position of impingement of the detected nuclear particles and is linearly related to the flux or rate of change and/or number or pattern of detected particles. The released stored energy does not need to be filtered and is thus sensed in order to provide an electrical signal corresponding to the particle events recorded on the large area particle detector. Both the filter if any, recording medium and sensor and other associated optics which may be utilized are contained within a light-tight enclosure. The electrical signal is then analyzed by a conventional microcomputer. In order to erase the information stored on the large area particle detector, a near-infrared or infrared source of radiation can be utilized. It should be understood, however, that the large area particle detector of the present invention can be read many times by use of a pulsed infrared or near-infrared solid-state source, without significantly depleting the stored information on the particle detector. For purposes of erasing, a much higher intensity or different wavelength infrared or near-infrared radiation source may be utilized which is preferably used in a continuous transmission mode instead of the pulsed mode of the "reading" source. If it is desired to obtain the integral of the stored photon energy, then a high intensity radiation source is utilized, which also functions to "erase" the stored energy from the detector. If operating in a scanning mode, it is also possible to operate the reading source in a continuous wave mode.

Alternatively, the apparatus aspects of the invention may be accomplished utilizing an x-y stepping stage containing a near-infrared semiconductor diode laser which "reads" the stored nuclear particle information pattern from the large area particle detector. A photomultiplier tube may function as a sensor for reading the released light energy and converting that light energy to electrical signals.

The method of the present invention may be carried out by a large area particle detector which includes a thick or thin film of electron trapping material which provides the means for detecting and storing the existence of the previous impingement of nuclear particles and the position and intensity thereof within its environment. The impingement of nuclear particles may be read instantaneously by means of a sensor for sensing the visible light energy which is given off by the large area particle detector electron trapping material upon impingement of the nuclear particles. The method of the present invention may also be effectuated by means of later readout by an infrared or near-infrared radiation source. In either event, the light energy released is converted to an electrical signal by an appropriate sensor and then analyzed by, for example, a conventional microcomputer.

With these and other objects, advantages and features of the invention that may become hereinafter apparent, the nature of the invention may be more clearly understood by reference to the following detailed description of the invention, the appended claims, and to the several drawings attached herein.

BRIEF DESCRIPTION OF THE DRAWINGS

FIG. 1 is a schematic block diagram of a system for detecting nuclear particles utilizing a large area particle detector;

FIG. 2 is a schematic block diagram of another embodiment of a system for detecting nuclear particles utilizing a large area particle detector;

FIG. 8 is a diagram of yet another embodiment of the large area nuclear particle detector system of the present invention showing that portion of FIG. 1 suitably configured for detection of alpha particles;

FIG. 9 is a pictorial diagram of a hard-surface alpha probe using the thin film large area particle detector shown in FIG. 7.

DETAILED DESCRIPTION OF THE PREFERRED EMBODIMENT

Figure 3:
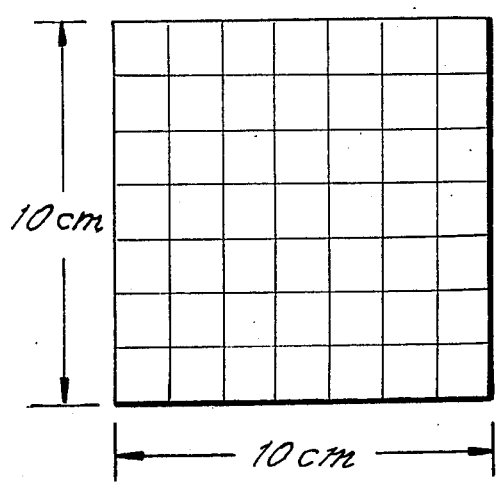
FIG. 3 is a diagram illustrating a top view of a thick film embodiment of a large area particle detector for use with the system shown in FIGS. 1 and 2.

Referring now in detail to the drawings wherein like parts are designated by like reference numerals throughout, there is illustrated in FIG. 1 a particle detection system 10 for use with a large area particle detector 12, fabricated as will be described later herein. Incoming particles 14 impinge upon the large area particle detector 12, causing electrons therein to be raised up in energy level to a trapped state as has been briefly described herein. Due to the use of the electron trapping materials in constructing the particle detector, visible scintillation occurs as nuclear particles 14 impinge on the detector 12. In addition, means are provided for subsequently detecting the nuclear particle impingement information pattern stored in the electron trapping material of the detector 12, by means of the visible-wavelength luminescence produced by near-infrared interrogation using an infrared emitting diode 16. The diode 16 may preferably have a wavelength centered about 960 nm.

Alternatively, a laser having a similar wavelength or other solid state device could also be utilized. The diode 16 is powered by an appropriate constant current supply 18. A second infrared or near infrared light source 20 which may be operated at a higher power level or at a different wavelength, can be utilized to "erase" the impingement pattern, when desired. The output of both diodes is controlled by setting its input current utilizing the regulated constant current power supply 18.

The pulsing of the diode 16 serves to provide the stimulation for releasing the trapped electrons in the electron trapping (ET) material contained in the large area particle detector 12 to produce visible luminescence. The luminescence exiting from the rear (as shown in FIG. 1) of the large area particle detector 12, is reflected by a mirror 15 and passes first through a short-pass filter 22 in order to block near-infrared wavelength signals, and then through the image intensifier and zoom optics 24 until the luminescence impinges upon a luminescence sensor 26. The shortpass filter may preferably be a 650 nm wavelength filter. Other than the computer 30 and power supply 18, the entire detector system 10 is contained within a light-tight housing 28 having a window 13 which is transparent to alpha, beta, gamma and x-rays, but not to ambient or lower energy light.

The sensor 26 may be either a photo-multiplier tube, such as a Hamamatsu Model R268 photo-multiplier tube, or can be configured as a parallel opto-electronic image capture array, such as the EG & G Reticon 256×256 device. Alternatively, the sensor 26 may be a Fairchild CCD 222 camera chip with a micro-channel plate intensifier and zoom optics 24. In the event that the EG & G Reticon diode array is utilized, it may not be necessary to use the image intensifier and zoom optics 24.

It should be understood that when it is desired to erase the stored light images, the infrared source 20 is turned on continuously for a brief period of time. It should also be understood that the readout of the stored electrons can be accomplished from either side of the large area particle detector 12, assuming there is no reflective coating applied to that side. Thus, with the large area particle detector 12 as shown in FIG. 1, either infrared source 16 or 20 could be configured on either side of the detector 12 to either read out or erase the stored light images on the large area particle detector 12, depending upon its operating conditions and provided that light-tight conditions are still maintained.

The output from the sensor 26 can readily be analyzed by a computer 30, such as a commercially available microcomputer. Utilizing the construction of the detector system of FIG. 1 in which the large area particle detector measures 10 cm×10 cm, yielding a 100 square centimeter area, the system is capable of a resolution of a "pixel" size of approximately 400 micrometers. With an optical "zoom" capability as described, the system is capable of examining storage pixels of about 10 microns in size over smaller areas of interest, for example, 25 mm×25 mm.

A second embodiment of the large area particle detection system 10 is shown in FIG. 2. In this embodiment, the infrared source 16a is secured to an x-y stepping stage 32, such as that available from Aerotech for serial scan-readout. Under control of the microcomputer 30, the x-y stepping stage 32 serves to scan the stored electron population in a pixel-by-pixel manner, using a focused semiconductor diode laser 16a. The release of the electrons from the large area particle detector 12, after passing through a short-wave optical filter 22 impinge upon a sensor 26, which may preferably be a photo-multiplier tube as described above. The output from the sensor 26 is analyzed by the microcomputer 30. The erasing source 20 of both FIGS. 1 and 2 may preferably be a near-infrared device for ease of sequential use of the detector system. As will be obvious to those of ordinary skill in the art, many other types of sensor systems may be utilized in order to provide the desired resolution capability to quantitatively capture stored information from the large area particle detector 12 at the above-described pixel size. In addition, the illumination sources 16 and 16a may also be by near-infrared devices having wavelengths in the range 0.8 to 1.4 microns or 800 to approximately 1400 nm. Such a system provides built-in storage of particle impingement as well as rapid readout upon command. Such a system may be utilized, for example, in industrial or medical radiography with laser-diode readout of the stored images. It may also be utilized in biomedical radio tracer mapping in electrophoresis separation.

Referring now to FIGS. 3-7, there is shown therein various constructions for the large area particle detector 12. A number of detector configurations have been developed and depend upon the specific particles or radiation to be detected. Such detectors can be broken down into two general categories in which the electron trapping materials utilized with the large area particle detector 12 are useful. They are detectors in which the particulate radiation gives up its energy in the material that stores the information and detectors in which light is produced in one material and the event information provided by that light is detected and stored in another material. Detectors of the first type are suitable for the detection of non-relativistic particles and are similar to commonly available detectors that use scintillators.

Detectors of the second type are useful for the detection of Cerenkov radiation from the passage of relativistic particles. For example, light produced in either quartz or sapphire will generate trapped electrons in the electron trapping material, thereby storing event information for subsequent retrieval. The formulation of electron trapping material required for Cerenkov radiation detection may be different from that required for non-relativistic particle detection because the process leading to the generation of trapped electrons is different. For example, the material for Cerenkov detection and storage need only be sensitive to light wavelengths between 300 and 600 nm and need have little sensitivity to higher energy processes. However, for non-relativistic particle detectors, a sensitivity for higher energy processes is required.

Figure 4:
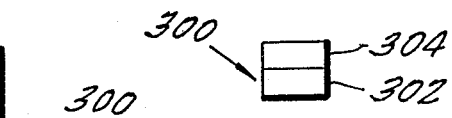
FIG. 4 is a diagram of a side view of one of the plurality of blocks which make up the large area particle detector shown in FIG. 3.

Two different approaches are shown in the drawings and are discussed herein for fabricating the specific large area particle detectors 12 specific to particular particle radiations. One approach is to slice and polish wafers obtained from rods prepared from thick film electron trapping formulations. Examples of such thick films are disclosed in the assignee's U.S. Pat. No. 4,864,536 System Memory and Method of Using Same Ser. No. U.S. Pat. No. 4,822,520 entitled PHOTOLUMINESCENT MATERIALS FOR OUTPUTTING BLUE-GREEN LIGHT; and U.S. Pat. No. 4,812,659 entitled INFRARED SENSING DEVICE OUTPUTTING BLUE-GREEN LIGHT, the disclosures of each of those applications being incorporated by reference herein. The thick film material composition disclosed in such co-pending applications may be compressed into rods or other shapes and fired until it is a high density solid. Wafers are then sliced from the rods and polished. Wafer thicknesses are preferably in excess of 0.025 cm. Each of those wafers, which may preferably be of a circular or rectangular shape, are sized such that they may be mosaicked to fill the desired detection area. FIG. 3 illustrates a mosaicking of a plurality of those wafers, having a rectangular shape, on a substrate. FIG. 4 is a side view of one of the wafers 300 showing the substrate 302 to which the wafers 300 are attached and the thick film phosphor material 304. The various substrate materials and phosphor compositions are as disclosed in the aforementioned co-pending patent applications.

Figure 4A:
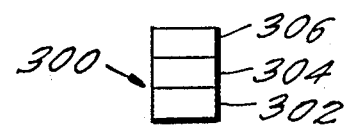
FIG. 4a is a diagram of a side view of an alternative embodiment of one of the plurality of blocks which make up the large area particle detector shown in FIG. 3.

Depending upon the individual front or back readout configuration and source exposure methodology utilized, an aluminum reflecting film 306 may be deposited on one surface of the polished wafers 300 so as to enhance the output luminescence produced by the infrared light exposure. Such a structure is shown in FIG. 4a.

As has been previously described in connection with FIGS. 1 and 2, the infrared or near-infrared source used to read the stored electrons may be configured to impinge on either the front or back of the large area particle detector 12. In the event that an aluminum or other reflecting film is deposited on one surface of the polished wafers, the illuminating and erasing infrared sources 16 and 20, respectively, would be arranged to impinge upon the opposite surface of the particle detector 12.

Figure 5:
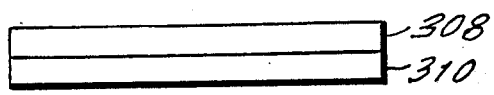
FIG. 5 is a diagram of a side view of a two layer embodiment of a thin film embodiment of a large area particle detector for use with the systems of FIGS. 1 and 2.
Figure 6:
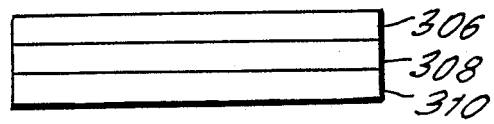
FIG. 6 is a diagram of a side view of a three layer film embodiment of a large area particle detector for use with the systems of FIGS. 1 and 2.
Figure 7:
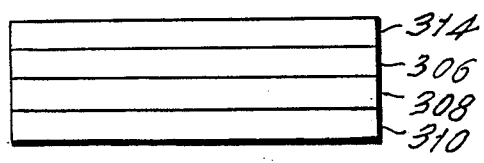
FIG. 7 is a diagram of a side view of a four layer thin film embodiment of a large area particle detector for use with the systems of FIGS. 1 and 2.

A second embodiment of the large area particle detector 12 is shown in FIGS. 5-7. In the second embodiment, a thin film 308 is deposited on an appropriate substrate 310. The thin film 308 may preferably be in excess of 10 microns in thickness. The thin film layer 308 may be deposited onto a sapphire substrate 310. However, alternative substrates such as quartz, glass or plastic may also be used. It is important to note that all of the components in the source material used to create the thin film layer 308 be transferred to the substrate 310 so that the resultant film 308 is uniform in composition and closely approximates the desired material composition a set forth in the co-pending applications. Such a structure can be accomplished by utilizing a very rapid electron beam evaporation, preferably at a rate of between 10–20 nm per second, of a small slug of an appropriate phosphor composition. Such appropriate phosphors are disclosed, for example, in the assignee's U.S. Pat. No. 4,812,660 entitled Photoluminescent Materials for Outputting Yellow-Green Light; and U.S. Pat. No. 4,855,603 entitled Photoluminescent Materials for Radiography. The disclosure of both of those patents is incorporated by reference herein.

Utilizing the compositions disclosed in co-pending thin film electron trapping composition patent application, U.S. Pat. No. 4,915,982 entitled METHOD OF MAKING THIN FILM PHOTOLUMINESCENT ARTICLES, a rapid deposition results in opaque films of very small crystallites that require annealing to become photo-active. The annealing increases the crystallite structure by a factor of 10 and changes the opacity such that the originally opaque film becomes nearly transparent to the eye. By use of a sputter deposition process, it may be possible to deposit such a film directly on a substrate, such as plastic, without having to perform an annealing cycle. The resulting layer on the substrate will be uniform, of high quality and nearly specular film. Such sputtering techniques will produce a homogenous film over a varying range of deposition rates.

Films prepared as described above could readily also be used as Cerenkov radiation detectors and storage media. Those thin films can also serve as detectors of low energy particulate radiation with the range of the various particles approximately corresponding to the film thickness for best detection capability. Utilizing either thick films or thin films, it is possible to detect both alpha particles, beta particles, and gamma particles, as well as x-rays or other particles.

FIG. 6 is a side view of an alternative embodiment to FIG. 5 of the large area particle detector 12. Three layers are utilized in the embodiment of FIG. 6, namely a substrate layer 310, a thin film layer 308 and a reflecting layer 306, as previously described.

FIG. 7 shows a side view of a third alternative embodiment for the large area particle detector 12 which utilizes a substrate 310 which may preferably be of 1 mm in thickness, a thin film scintillator layer 308 (alternatively referred to hereafter as "thin film 308" or "scintillator screen 308"); which is of thickness matched to the alpha particle range of an inorganic thin film scintillator material, which is disclosed in U.S. Pat. Nos. 4,855,603 and 4,812,659. These particular thin films are very resistant to permanent radiation damage and offer built-in selective radiation sensitivity because gamma and beta particles will generally be more readily transmitted by the film 308, but alpha particles will be nearly fully absorbed. The thin thin film scintillator layer 308 may be preferably coated with a 500 Angstroms thickness layer of aluminum 306 in order to enhance photon reflectance towards the detector.

A corrosion-protection coating 314, as will be described later herein, may preferably be deposited directly on top of the aluminum layer 306 and may preferably be a layer of approximately 1 micrometer in thickness. Materials which may be used for the alpha window layer include nickel, chrome, nickel-chrome alloy, titanium, and vanadium. Such a layer of, for example, chromium, would provide many orders of magnitude greater abrasion resistance than the commonly used 0.25 mil (6 microns) aluminized free standing mylar membrane which scratches and tears, and could readily be formed onto 100 cm$^2$ surfaces by either chemical plating or evaporation methods, both of which can yield pinhole free coatings down to a micron in thickness. Thus, the structure of FIG. 7 may form a multilayer scintillator structure in which the alpha window 314 and scintillator screen 308 can be formed as a single plate.

Referring now to FIG. 8, there is shown therein a pictorial diagram of yet another embodiment of a large area particle detector system 10. This particular detector system 10 is designed for the detection and storage of information relating to alpha particles 82. A scintillator or large area particle detector 84 is used as a detector upon which the alpha particles 82 impinge. The large area alpha particle detector 84 may preferably be of a rectangular shape and measure at least 1 cm on a side, however it could also be constructed of a much larger size, for example a square meter.

The scintillator 84 is placed at one end of a lightproof enclosure 28 having an opening 86 which is somewhat smaller than the width and the height of the scintillator 84. The scintillator 84 may be constructed from materials as described in connection with and shown in FIG. 7. A funnel-shaped light guide 88, which is of a hollow cone shape sized to an appropriate size for the detector or scintillator 84, may be used to "capture" and guide the light produced upon impingement of an alpha particle 82 on the scintillator 84. Of course, it should be understood that the impingement information can be stored and later "read" in the manner described in connection with FIGS. 1 and 2. The hollow cone light guide 88 may be coated with a highly reflecting material on the inside and acts essentially as an integrating sphere.

It should also be understood that the luminescence produced upon impingement of an alpha particle may be coupled directly into a quartz-like guide which would be tapered in a similar manner to contain the scintillator or detector 84 at its wide end and a detector 90 at the opposite. In yet another alternative embodiment, the scintillator 84 may be formed onto a planar-like guide (as in FIG. 9), thus guiding the luminescence generated by impingement of the alpha particles 82 onto the scintillator 84 to a single edge where a detector would be positioned.

The scintillator 84 of FIGS. 8 and 9 is formed by means of a transparent inorganic thin film 308 coated on a suitable substrate 310 as shown in FIGS. 5–7. Such a thin film, which is disclosed in U.S. Pat. No. 4,855,603 and U.S. Pat. No. 4,812,659, is extremely hard and abrasion resistant, thermally stable and very resistant to permanent radiation damage. In addition, the particular composition of the thin film 308 utilized can be varied such that it provides built-in selective radiation sensitivity so that only alpha particles will be nearly absorbed. The thin film 312 may readily accept a 500 Angstroms thickness layer of aluminum 306 in order to enhance photon reflectance towards the detector 90 An alpha window 314 could also be deposited directly on top of the aluminum layer. Such a metallic layer 314, as previously described in connection with FIG. 7, may readily be formed onto an area of greater than 100 cm$^2$ by either chemical plating or evaporation methods, both of which can yield pinhole free-coatings at a thickness of 1 micron. Thus, the structure of the scintillator 84 has the benefit that the alpha window 314 and the scintillator screen 308 are physically formed into a single plate. Such a plate could be easily and quickly replaced, similar to replacing a broken lens on a flashlight, if needed. In addition, such a plate would provide superior wear resistance and could be readily cleaned if contaminated.

The detector 90 may be configured from one of many types of known detectors. The following types of detectors may be utilized: discrete dynode photo-multiplier tube, semiconductor photo-diode and micro-channel plate photo-multiplier. In the preferred embodiment, a photo-multiplier is utilized. Such a configuration offers several advantages over the use of the other types of detectors, namely, very close spectral-matching between the photocathode and the scintillator screen composition emission wavelength may be obtained. Secondly, photo-multiplier tubes are extremely rugged and are especially suited for harsh environmental use.

In the preferred embodiment, p-i-n photo-diodes are preferably utilized because they provide extremely fast response times. However, the overall detection system 10 response time will be limited by the decay time of the scintillator 84. Since the scintillator 84 decay time is approximately 200 nanoseconds, a reverse biased photovoltaic type detector exhibiting a 50 nanosecond response time would be adequate for alpha particle detecting.

In addition, the efficacy of the semiconductor detector may be increased by modifying the composition of the scintillator screen 308 such that its luminescent wavelength spectrum is shifted to longer wavelengths in order to better match the photodetector's spectral response. The thickness of the thin scintillator screen 308 when used for detection of alpha particles, is preferably within the alpha particle range which is approximately 5–30 microns.

Referring now to FIG. 9, there is shown therein the alternative approach discussed above in which the basic structure of FIG. 7, namely the scintillator screen 308 and alpha window 314 layered with an appropriate substrate 310 and aluminum reflecting layer 306 is formed into a paddle shape detector 100 having a rectangular surface area for impingement by alpha particles 82 of at least 10 cm². The photons, which are released as a result of impingement by alpha particles 82, travel through a planar light guide 88, from the scintillator area to the narrow end of the guide, to where they are coupled to the detector 90.

It should be understood that in using the above-described large area particle detector 12 or scintillator 84, respectively, together with the systems shown respectively in FIGS. 1 and 2 and 9, a resolution over the area of the detector or scintillator of approximately 0.1 mm may be obtained.

Furthermore, when utilizing the thick film type of material discussed in connection with FIGS. 3 and 4, the following process may be used. The crystallite mixture itself, as is disclosed in various referenced co-pending patent applications, is formed from alkaline earth sulfides which are doped with impurities from the lanthanide or rare earth series of elements in order to produce the electron trapping phenomenon described herein.

The crystallite and fusible salt mixture is then heated to high temperatures of approximately 1000° centigrade or more in order to fuse, diffuse and recrystallize the components. Such heating is accomplished in a dry, neutral gas, such as nitrogen or argon. The fused bulk of crystallites may be ground to a fine powder and the resulting fine powder can be dispensed onto different surfaces by use of an appropriate binder, such as optically clear epoxy. The fine power can also be compressed into various shapes or rods before firing. Alternatively, it is possible to form crystallites directly on high temperature substrates. However, the use of a thin film electron trapping material composition is much preferred since such thin films are about 5 times more efficient than thick films per unit volume. That is, thin films produce 5 times more photon induced storage per unit volume than do thick films. When thick films are used, they preferably will be in the range of thicknesses of up to 250 microns. The depth of the traps utilized may preferably be approximately one electron volt, particularly for the material disclosed in U.S. Pat. Nos. 4,855,603; 4,812,659; 4,812,660.

Figure 10:
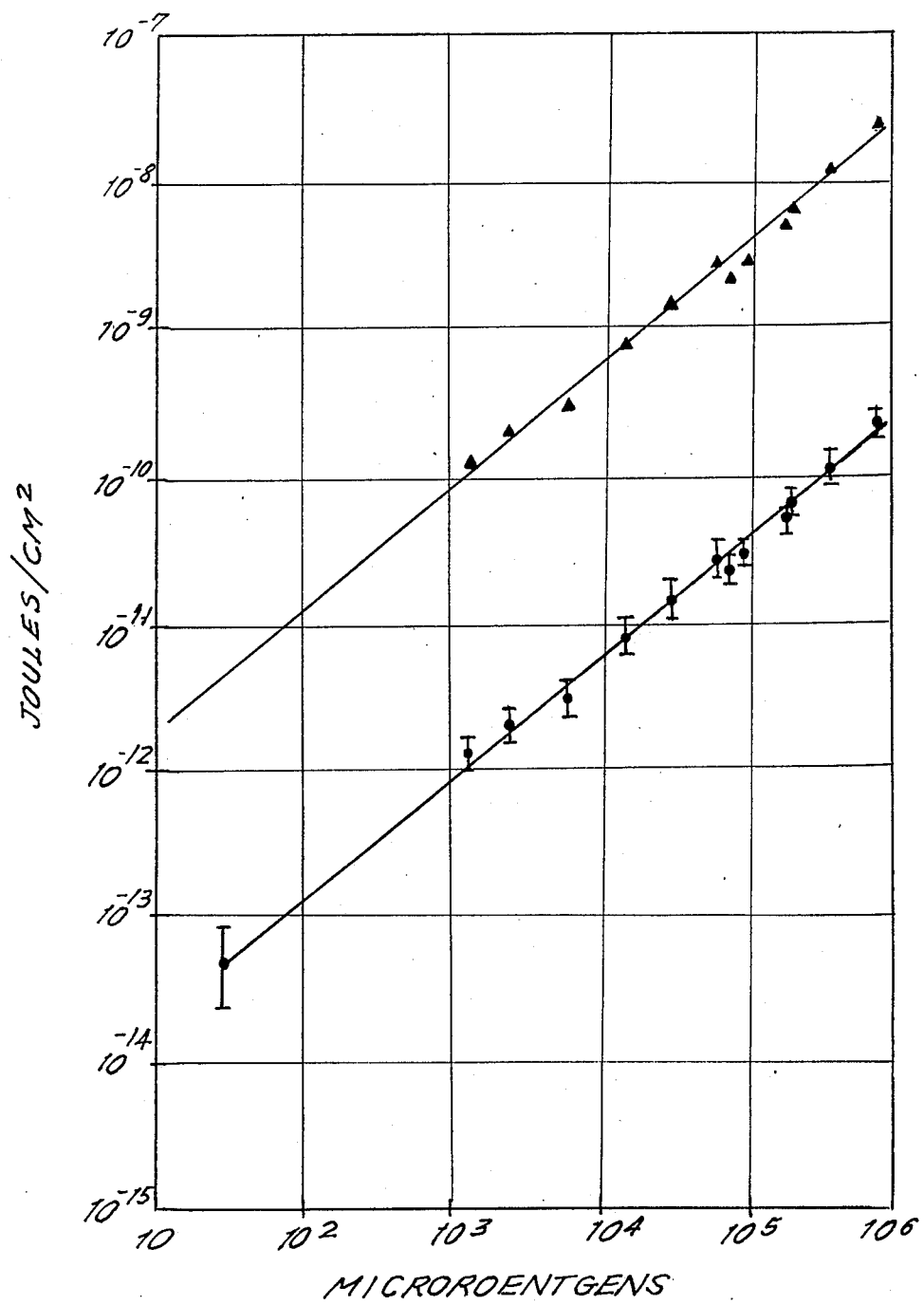
FIG. 10 is a graph showing the relationship between the dose of radiation impinging on the large area particle detector of the present invention and the released energy per area of the detector emitted as a result of reading the stored previously impinged radiation.

FIG. 10 shows the resulting luminescence intensity obtained from the phosphor disclosed in U.S. Pat. No. 4,855,603 for a given level of radiation. It is believed that the other phosphors disclosed herein and in the cited co-pending applications may exhibit similar ratios of luminescence intensity per level of radiation. As can be seen from the lower and upper levels in FIG. 10, the luminescence energy per square centimeter of storage medium ranges from about 5 to about 50 nanojoules per Roentgen (or rad), respectively.

It should also be understood that the large area particle detectors disclosed herein are capable of detecting alpha, beta, gamma, x-ray and other nuclear particle impingements.

Although only a preferred embodiment is specifically illustrated and described herein, it will be appreciated that many modifications and variations of the present invention are possible in light of the above teachings and within the purview of the appended claims without departing from the spirit and intended scope of the invention.

What is claimed is:

1. A particle detector for storing information for later retrieval corresponding to the impingement of radiation particles on its surface, comprising:
   means for detecting and storing information corresponding to the impingement of a pattern of radiation particles, comprising an electron trapping material for releasably storing energy corresponding to the flux and pattern of said impingement radiation particles, said electron trapping material comprising:
      a base material comprising an alkaline earth methal sulfide,
      a first dopant of samarium, and
      a second dopant of a cerium compound;
   means for applying a first wavelength of light to said means for detecting and storing information for causing said electron trapping material to release said stored energy in the form of light of a second wavelength corresponding to said flux and pattern of said impinging radiation particles; and
   means for sensing released light of said second wavelength and for converting said released light to electrical signals representative of said flux and pattern of said impinging radiation particles.

2. The particle detector of claim 1, further including means for applying a third wavelength of light to said means for detecting and storing energy for erasing the information stored thereon.

3. The particle detector of claim 1, wherein said pattern of impinging radiation particles is impinging on said detector and being stored over a period of time, effectively integrating the resulting stored pattern.

4. The particle detector of claim 1, wherein said electron trapping material is provided in a thin film having a thickness of between 1 and 100 microns.

5. The particle detector of claim 1, wherein said detector has resolution of at least approximately 0.1 mm.

6. The particle detector of claim 1, wherein said electron trapping material contains traps having a depth of about 1 eV.

7. The particle detector of claim 1, wherein at least 50 nanjoules of light energy of said second wavelength per square centimeter of said electron. trapping material is released per rad of impinging radiation particles.

8. Apparatus for detecting and storing a radiation pattern, comprising:
   means for detecting and storing said pattern of radiation, said detecting and storing means comprising a substrate with a layer of electron trapping material which releasably stores said radiation pattern, said electron trapping material comprising:
      a base material comprising an alkaline earth methal sulfide,
      a first dopant of samarium, and
      a second dopant of a cerium compound;
   means for applying a first wavelength of light energy to said means for detecting and storing to cause said layer of electron trapping material to emit light energy of a second wavelength corresponding to the pattern and intensity of said stored radiation pattern;
   means for sensing said light energy of said second wavelength and converting said light energy to corresponding electrical signals; and
   means for analyzing said electrical signals.

9. The apparatus of claim 8 further including means for applying a third wavelength of light to said means for detecting and storing for erasing the radiation pattern stored thereon.

10. The apparatus of claim 8, wherein said radiation pattern is stored over a period of time, effectively integrating the resulting stored pattern.

11. The apparatus of claim 8, wherein said electron trapping material is provided in a thin film having a thickness of between 1 and 100 microns.

12. The apparatus of claim 8, wherein said system has a resolution of approximately 0.1 mm or better.

13. A method of detecting and storing for later read out a pattern of radiation, comprising the steps of:
   utilizing a particle detector and storage means comprising an electron trapping material for releasably storing energy corresponding to said pattern of radiation, said electron trapping material comprising:
      a base material comprising an alkaline earth methal sulfide,
      a first dopant of samarium, and
      a second dopant of a cerium compound;
   applying a first wavelength of light energy to said particle detector and storage means to cause said electron trapping material to release said stored energy in the form of light of a second wavelength representative of the pattern and intensity of said radiation pattern;
   sensing said light energy of said second wavelength and converting said light energy to corresponding electrical signals; and
   analyzing said electrical signals.

14. The method of claim 13, further including the step of applying a third wavelength of light to said said electron trapping material for erasing the radiation pattern stored therein.

15. The method of claim 13, wherein said radiation pattern is cumulatively stored over a period of time, thus effectively integrating the resulting stored pattern.

16. The method of claim 13, wherein said particle detector and storage means comprises an electron trapping material provided in a thin film on a substrate, said thin film having a thickness of between 1 and 100 microns.

17. The particle detector of claim 1, wherein said base material of said electron trapping material comprises substantially strontium sulfide, said first dopant of samarium is provided in a quantity of between 70 to 300 parts per million by weight, and said second dopant of a cerium compound comprises cerium oxide provided in a quantity of between 600 to 1500 parts per million by weight.

18. The particle detector of claim 1, wherein said base material of said electron trapping material comprises substantially calcium sulfide, said first dopant of samarium is provided in a quantity of between 50 to 300 parts per million by weight, and said second dopant of a cerium compound is selected from the group of cerium oxide, cerium fluoride, cerium chloride, and cerium sulfide provided in a quantity of between 200 to 1500 parts per million by weight.

19. The apparatus of claim 8, wherein said base material of said electron trapping material comprises substantially strontium sulfide, said first dopant of samarium is provided in a quantity of between 70 to 300 parts per million by weight, and said second dopant of a cerium compound comprises cerium oxide provided in a quantity of between 600 to 1500 parts per million by weight.

20. The apparatus of claim 8, wherein said base material of said electron trapping material comprises substantially calcium sulfide, said first dopant of samarium is provided in a quantity of between 50 300 parts per million by weight, and said second dopant of a cerium compound is selected from the group of cerium oxide, cerium fluoride, cerium chloride, and cerium sulfide provided in a quantity of between 200 to 1500 parts per million by weight.

21. The method of claim 13, wherein said base material of said electron trapping material comprises substantially strontium sulfide, said first dopant of samarium is provided in a quantity of between 70 and 300 parts per million by weight, and said second dopant of a cerium compound comprises cerium oxide provided in a quantity of between 600 to 1500 parts per million by weight.

22. The method of claim 13, wherein said base material of said electron trapping material comprises substantially calcium sulfide, said first dopant of samarium is provided in a quantity of between 50 to 300 parts per million by weight, and said second dopant of a cerium compound is selected from the group of cerium oxide, cerium fluoride, cerium chloride, and cerium sulfide provided in a quantity of between 200 to 1500 parts per million by weight.

* * * * *